United States Patent [19]

Murakami

[11] Patent Number: 5,177,572
[45] Date of Patent: Jan. 5, 1993

[54] MOS DEVICE USING ACCUMULATION LAYER AS CHANNEL

[75] Inventor: Yoshinori Murakami, Kanagawa, Japan

[73] Assignee: Nissan Motor Co., Ltd., Japan

[21] Appl. No.: 680,666

[22] Filed: Apr. 5, 1991

[30] Foreign Application Priority Data

Apr. 6, 1990 [JP] Japan ............ 2-90095

[51] Int. Cl.$^5$ ............ H01L 29/78
[52] U.S. Cl. .......... 257/260; 257/330; 257/471; 257/622
[58] Field of Search ........ 357/23.4, 15, 56, 68, 357/41

[56] References Cited

U.S. PATENT DOCUMENTS

| | | | |
|---|---|---|---|
| 4,737,831 | 4/1988 | Iwai | 357/23.4 |
| 5,040,034 | 8/1991 | Murakami et al. | 357/23.4 |

FOREIGN PATENT DOCUMENTS

| | | | |
|---|---|---|---|
| 58-61673 | 4/1983 | Japan | 357/23.4 |
| 62-115775 | 5/1987 | Japan | 357/23.4 |
| 62-274775 | 11/1987 | Japan | 357/23.4 |
| 2103419 | 2/1983 | United Kingdom | 357/23.4 |

Primary Examiner—Rolf Hille
Assistant Examiner—Steven Loke
Attorney, Agent, or Firm—Lowe, Price, LeBlanc & Becker

[57] ABSTRACT

A semiconductor device comprises: a drain region made of one conductivity type semiconductor substrate having first and second major surfaces; a source region made of one conductivity type first impurity region and formed inside said drain region with being in contact with said first major surface of the drain region; a gate electrode formed in a first groove having a U shape and covered with an insulating film, said U-shaped first groove being dug from said first major surface of the drain region into said inside of the drain region and positioned in contact with one side of said source region; a second groove dug from said first major surface into said inside of the drain region and positioned in contact with the other side of said source region, a metal functioning as a source electrode being embedded into said second groove so as to constitute a Schottky junction with said drain region; a drain electrode electrically connected to said second major surface of the drain region; and, a channel region formed in a portion of said drain region which is sandwiched by said gate electrode 4 and said metal 33 of the source electrode, said channel region being depicted by means of both a difference between work functions of a material of said gate electrode and of said channel region, and also said Schottky junction when at least a potential at said gate electrode is equal to that of said source electrode, and furthermore a ratio of a length of said channel region to a thickness thereof being selected to be such a value that even when a voltage of said drain electrode is increased to a desirable withstanding voltage, said channel region is not brought into a conduction state.

7 Claims, 20 Drawing Sheets

MOS DEVICE USING ACCUMULATION LAYER AS CHANNEL

BACKGROUND OF THE INVENTION

1. Field of the Invention

The present invention generally relates to a normally-off type MOS (metal oxide semiconductor) device. More specifically, the present invention is directed to a MOSFET having a low ON-resistance with a short channel formed in a depth direction thereof.

2. Description of the Related Art

Various types of MOS devices have been described in the semiconductor field, for instance, "MODERN POWER DEVICES" written by B. J. Baliga issued by J. Wiley & Sons Inc. New York, on page 236.

FIG. 1 is a sectional view of the conventional DMOS structure semiconductor device as described in the above-described publication. In the DMOS structure semiconductor device shown in FIG. 1, reference numeral 1 indicates an n-type drain, reference numeral 11 denotes a drain electrode; reference numeral 2 represents a p type base region; reference numeral 22 is a p+ type region for a contact of the base region; reference numeral 3 indicates an n+ type source region; reference numeral 33 represents a source electrode; reference numeral 4 is a gate electrode; reference numeral 5 denotes a gate insulating film; reference numeral 6 indicates an interlayer insulating film; symbol "C" indicates a channel; and also symbols "L" represents a length of this channel. It should be understood that the drain region 1 is in ohmic-contact with the drain electrode 11.

A structure of a typical lateral type MOSFET is so arranged that a plurality of unit structures, as represented in FIG. 1, are positioned in parallel with each other on a surface of the same semiconductor chip.

Operations of the conventional MOSFET shown in FIG. 1 will now be described.

It should be noted that the drain electrode 11 is biased at a positive potential and the source electrode 33 is grounded.

When the potential of the gate electrode 4 is equal to that of the source electrode 33, i.e., ground potential, no current flows between the source region 3 and drain region 1, because the path between these regions 1 and 3 is electrically cut off due to existence of the p type base region 2. Then, when a predetermined positive potential is applied to the gate electrode 4, an inversion layer is formed at the surface of the gate insulating film 5 adjacent to the p type base region 2 and this inversion layer functions as the channel "C", so that since the source region is electrically connected to the drain region, the main current flows therethrough.

In general, it is known that a so-called "ON-resistance", namely a resistance of a semiconductor device per se when it is under ON-state should be lowered as much as possible. In the above-described structure of the conventional MOS device, "a channel resistance" caused when the current flows through the inversion layer functioning as the channel, may give a major effect to the ON-resistance. The shorter, the channel length "L" is designed, the lower the channel resistance becomes, and also the smaller the dimension of the structure unit shown in FIG. 1 becomes. As a result, the current capacity per unit region may be increased. However, there is such a limitation that if the channel length "L" is made too short, the withstanding voltage characteristic of this device will be lowered. That is to say, the channel length is restricted to the allowable value which is determined by the breakdown voltage characteristic and threshold voltage.

Also, there is another problem in this MOS structure. That is, an npn bipolar transistor constructed of the drain region 1, base region 2 to source region 3 is present as a stray device. When a drain voltage with a rapid change is applied to this device, the stray transistor may function and thus the MOS device per se is broken.

Another typical MOS structure with a so-called "UMOS structure" is described in, for example, Japanese Laid-open Patent Application No. 58-63130.

In this known UMOS structure, the channel is formed in the depth direction of this structure so as to improve the density of the structure unit in such a manner that the insulating gate is formed in the groove which has been vertically dug from the surface of the semiconductor substrate and has a U shape, and the channel is formed on the side walls of this U-shaped groove.

In FIG. 2, there is shown the above-described UMOS structure as a sectional view. It should be noted that the same reference numerals shown in FIG. 1 will be employed for denoting the same or similar elements in FIG. 2.

As shown in FIG. 2, since the channel is formed in the lateral direction of this UMOS device, the dimension of the UMOS structure unit may be considerably reduced even with the same channel length as that of the MOS device shown in FIG. 1. As a result, although the ON-resistance of this UMOS structure become lower, there are still same problems as those of the first-mentioned MOS structure, namely the breakdown voltage and stray transistor matters.

As a MOS device with a shorter channel length, a static induction transistor (SIT) is well known in the art, for instance, from the above-described publication "MODERN POWER DEVICES" on page 182, in which both the junction gate and insulating gate have been proposed as the gate structure.

A static induction transistor does not employ an opposite conductivity type impurity region as a channel structure so that there is no stray device and ON-resistance is low, because the major current does not flow through a narrow region such as an inversion layer. On the other hand, the general vertical MOSFET structure which is applied no gate voltage can block the main current (normally-off) until the drain voltage increases to the breakdown voltage, but for static induction transistor, the opposite polarity voltage to that of the drain electrode must be applied to the gate electrode to block the main current. Even if such a structure capable of cutting the flow of the main current is realized under the grounded gate electrode, the main current will start to flow in accordance with an increase in the drain voltage, since the static induction transistor originally represents a triode characteristic, which may cause a difficult device treatment.

As previously described in detail, the conventional DMOS and UMOS devices own the following drawbacks. That is to say, there is a limitation in shortening the channel length because of the breakdown voltage and threshold voltage. As a consequence, it is rather difficult to reduce the channel resistance mainly functioning as the ON-resistance. Furthermore, there is a risk that these devices per se are broken down due to the existence of such an inherent stray transistor.

Moreover, the voltage having the polarity opposite to that of the drain electrode must be applied to the gate electrode of the static induction transistor in order to interrupt the flow of the main current. Since the static induction transistor represents the triode characteristic, the main current may start to flow in response to an increase of the drain voltage. Therefore, it is difficult to handle such a static induction transistor with satisfaction.

SUMMARY OF THE INVENTION

The present invention has been made in an attempt to solve the above-described problems, and therefore has an object to provide a novel semiconductor device such as a MOS device with a low ON-resistance and the same current block characteristic with conventional power MOS device (normally-off type) in spite of a shorter channel length.

To achieve the above-described objects of the present invention, a semiconductor device, according to the present invention, comprises:

a drain region (1) made of one conductivity type semiconductor substrate having first and second major surface;

a source region (3) made of one conductivity type first impurity region and formed inside said drain region (1) with being in contact with said first major surface of the drain region (1);

a gate electrode (4) formed in a first groove having a U shape and covered with an insulating film (5), said U-shaped first groove being dug from said first major surface of the drain region (1) into said inside of the drain region (1) and positioned in contact with one side of said source region (3);

a second groove dug from said first major surface into said inside of the drain region (1) and positioned in contact with the other side of said source region (3), a metal (33) functioning as a source electrode being embedded into said second groove so as to constitute a Schottky junction with said drain region (1);

a drain electrode (11) electrically connected to said second major surface of the drain region (1); and, a channel region formed in a portion of said drain region (1) which is sandwiched by said gate electrode 4 and said metal 33 of the source electrode, said channel region being depleted by means of both a difference between work functions of a material of said gate electrode (4) and of said channel region, and also said Schottky junction when at least a potential at said gate electrode (4) is equal to that of said source electrode, and furthermore a ratio of a length (L) of said channel region to a thickness (H) thereof being selected to be such a value that even when a voltage of said drain electrode (11) is increased to a desirable breakdown voltage, said channel region is not brought into a conduction state.

DETAILED DESCRIPTION OF THE PREFERRED EMBODIMENTS

Basic Ideas

It should be noted that the present invention is directed to such a novel MOS (Metal Oxide Semiconductor) device that an accumulation layer whose resistivity is lower than that of an inversion layer of the conventional MOSFET, is utilized as a channel thereof.

The first basic idea of a semiconductor device is such as a device having a UMOS structure that a gate electrode material is selected having such a work function that a drain region to which an insulated gate electrode is positioned adjacent, is depleted even when the insulated gate electrode is grounded and a source region is formed adjacent to the U-shaped insulated gate and another U-shape groove is formed adjacent to the source region and near the U-shape insulated gate, and a certain metal is filled in the groove as a source electrode. Since the metal and drain region adjacent to this metal makes a Schottky junction and the drain region nearby the junction is depleted, the channel region that the portion of the drain region sandwiched by the insulated gate electrode and the source electrode region sandwitched by the insulated gate electrode and the source electrode metal is depicted. Accordingly, the semiconductor device which never punches through is fabricated. Also, a ratio of a channel length "L" to a channel thickness "H" is selected to be such a value that even when a drain voltage is increased to a desired higher breakdown voltage, the channel is not opened. For the accumulation layer having an electrical resistivity lower than that of an inversion layer is formed around an insulating gate electrode. It should be understood that the length "L" of the channel region is equal to a length measured from an end portion of the source region at a drain side thereof to an end portion of the source metal at the drain side, whereas the thickness "H" of the channel region is equal to an interval between a surface of the gate insulating film and a surface of the source metal (see FIGS. 3 to 7).

Figure 9:
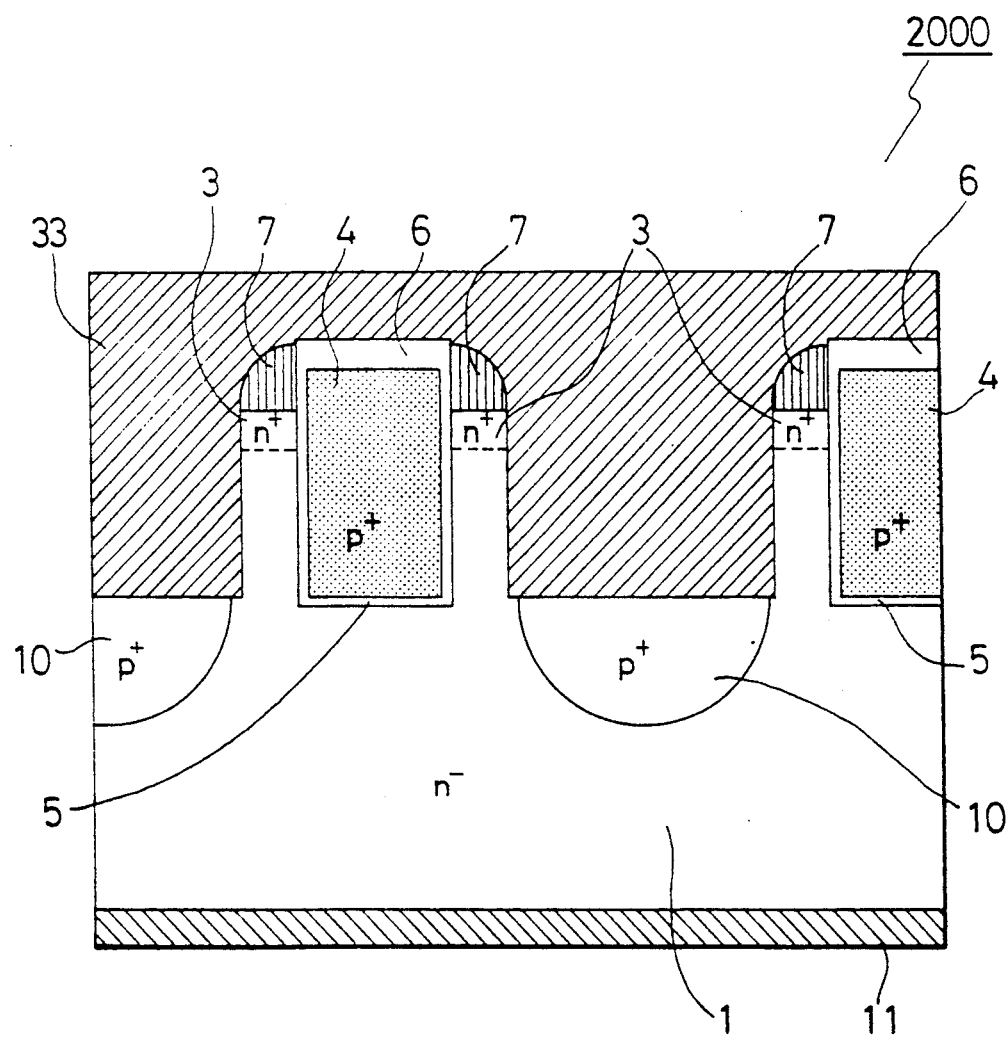
FIG. 9 is a sectional view of a semiconductor device according to a second preferred embodiment of the present invention.

In accordance with a second basic idea, a semiconductor device has such a particular structure that an opposite conductivity type region with respect to one conductivity type drain region is formed on either a part or an overall of a boundary plane (surface) between the source electrode metal and the drain region, which is not positioned opposite to the insulating gate electrode, in addition to the above-described basic structure of the first semiconductor device (see FIG. 9). With this second structure, a leak current from the Schottky junction may be mitigated when interrupting the flow of the main current.

Figure 3:
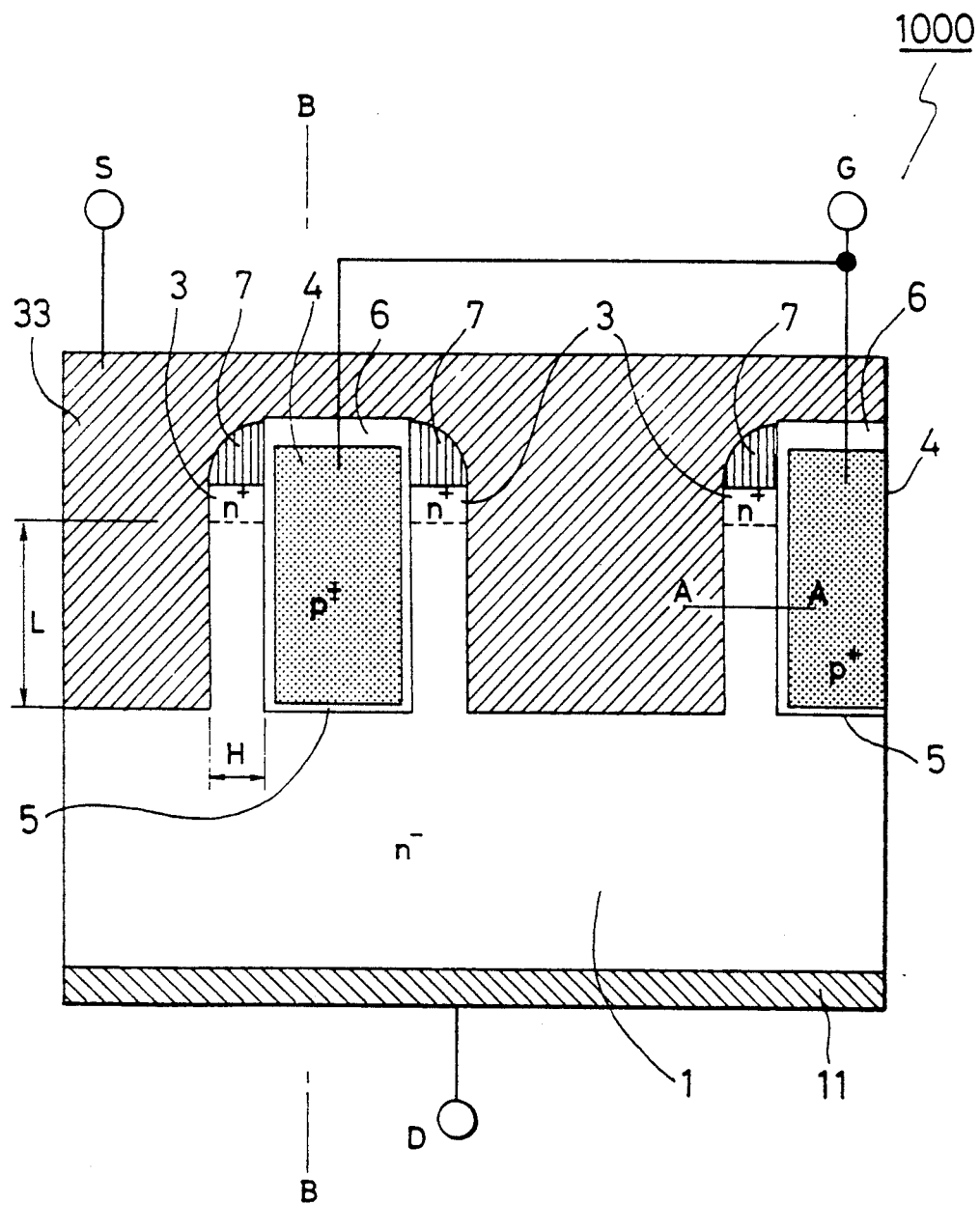
FIG. 3 is a sectional view of a semiconductor device according to a first preferred embodiment of the present invention.

Furthermore, according to a third basic idea of the present invention, a semiconductor device has such a particular structure that a portion of the source electrode metal is in contact with a surface of the insulating film which covers the gate electrode, in addition to the first-mentioned basic structure (see FIG. 10). With such a third featured structure, since the impurity density of the channel region may be set to be 4 times higher than that of the channel region shown in FIG. 3 under condition that the thicknesses "H" of both channels shown in FIGS. 3 and 10 are designed to be equal to each other, the resultant resistervity of the accumulation layer may be furthermore lowered.

Also, in accordance with a fourth basic idea of the present invention, a semiconductor device has such a featured structure that an opposite conductivity type impurity region with respect to one conductivity type drain region, which is electrically connected to a source electrode metal, is provided with a portion of a boundary between the insulating film for covering the gate electrode and the drain electrode, in addition to the first-mentioned basic structure (see FIG. 11). With the above-described fourth structure, since holes collected to the surface of the insulating gate are sucked into the above impurity region, no inversion layer is formed at the boundary plane of the gate insulating film, and there is substantially no risk that the potential at this boundary plane of the gate insulating film is increased.

Figure 12:
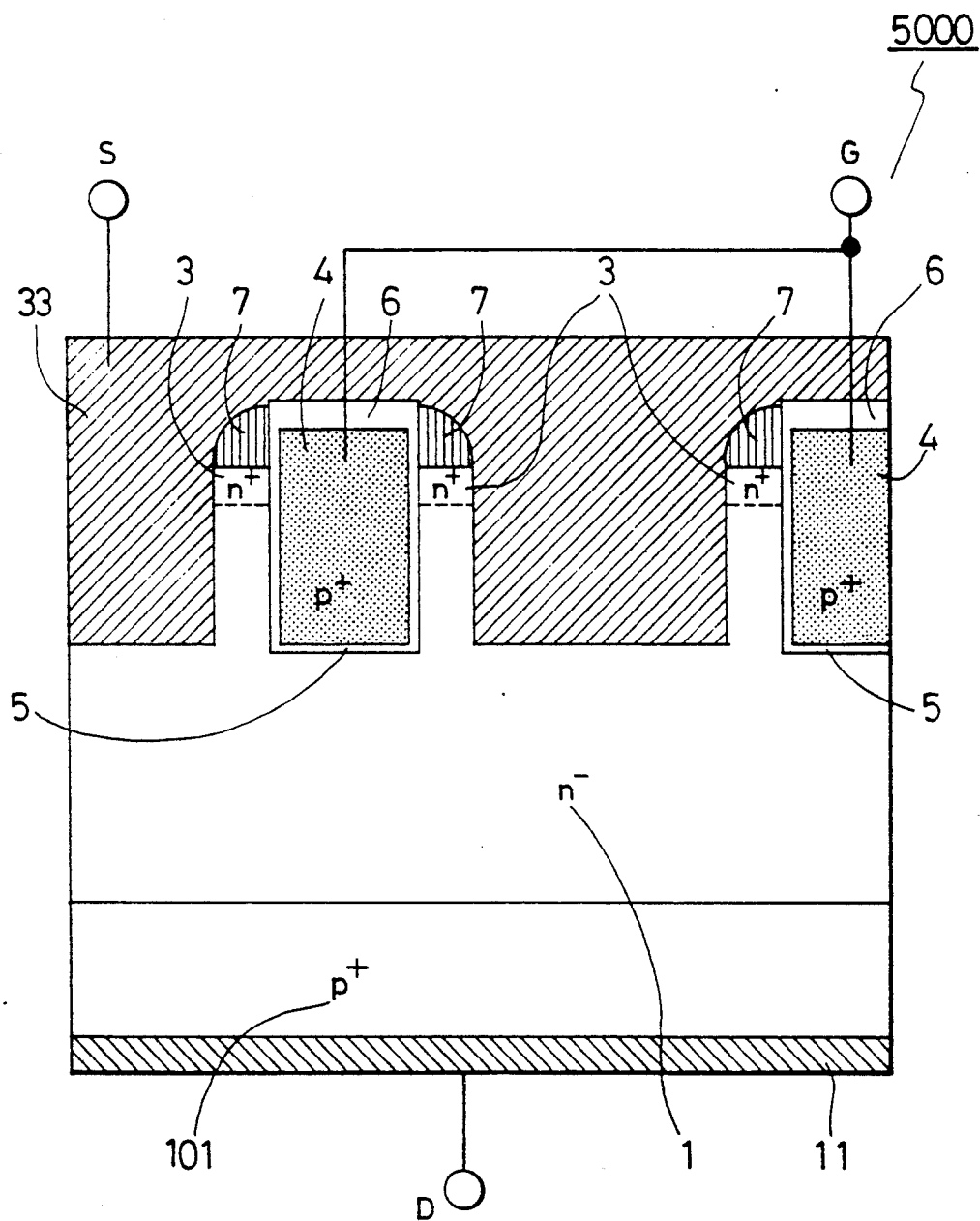

Finally, according to an fifth basic idea of the present invention, a semiconductor device has such a featured structure, in addition to the above-described basic structure, that a semiconductor region having an opposite conductivity type with respect to one conductivity type drain region is formed on at least a portion between the drain electrode and drain region (see FIG. 12). According to the fifth featured structure, there is a particular advantage that since injected carriers are not accumulated near the electrode, highspeed switching operation may be realized.

Structure of First Semiconductor Device

In FIG. 3, there is shown a sectional view of a semiconductor device (MOS device) 1000 according to a first preferred embodiment of the present invention. It should be noted that this first semiconductor device 1000 is manufactured by a silicon and based upon the first basic idea.

In the first semiconductor device shown in FIG. 3, reference numeral 1 indicates an n-type drain region; reference numeral 11 denotes a drain electrode; reference numeral 3 represents an n+ type source region; reference numeral 33 indicates a metal functioning as a source electrode (referred to a "source electrode metal"); reference numeral 4 indicates a p+ type polysilicon gate electrode; reference numeral 5 denotes a gate insulating film; reference numeral 6 represents an interlayer insulating film; and reference numeral 7 denotes a side wall for forming a channel region. It should be noted that symbol "L" indicates "a channel length" and symbol "H" denotes "a channel width" which are very important amounts of the semiconductor device according to the present invention. For the sake of convenience, both the gate electrode 4 and gate insulating film 5 will be referred to as an "insulated gate".

As apparent from FIG. 3, the source electrode metal 33 is embedded into a groove vertically formed in the substrate of this first semiconductor device 1000 in such a manner that this source metal 33 is positioned in parallel to the insulated gate (4 and 5). Then, the channel region is depleted even when the gate electrode 4 is under ground potential, because of both Schottky junction effect between the channel region and source metal, and a difference between a work function of the gate electrode 4. Originally, there is no clear distinction in the boundary between the drain region and the channel region corresponding to a part of the drain region. Accordingly, it is defined such that a channel region corresponds to a "region has an effect causing an interruption of a current flowing through a source-to-drain path which is sandwiched by the insulting gate and source metal 33 is the drain region".

As will be discussed in detail, a ratio of the channel region length "L" to the channel region thickness "H" is selected to be, for instance, approximately $L/H > 2$ in such a manner that the channel never opens even when the drain voltage is increased to a desirable higher withstanding voltage.

Operation Principle of First Semiconductor Device

Figure 1:
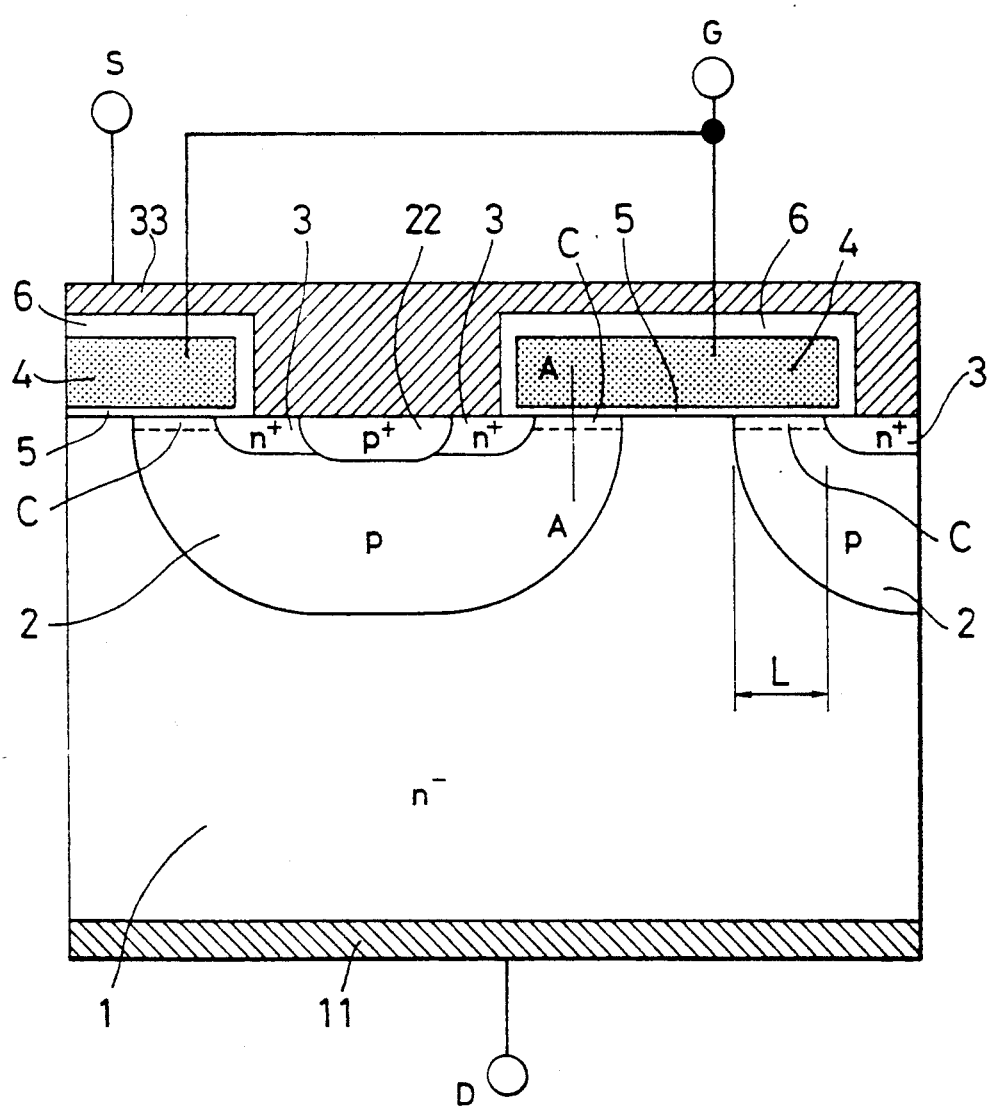
FIG. 1 is a sectional view of the conventional vertical type MOSFET.
Figure 2:
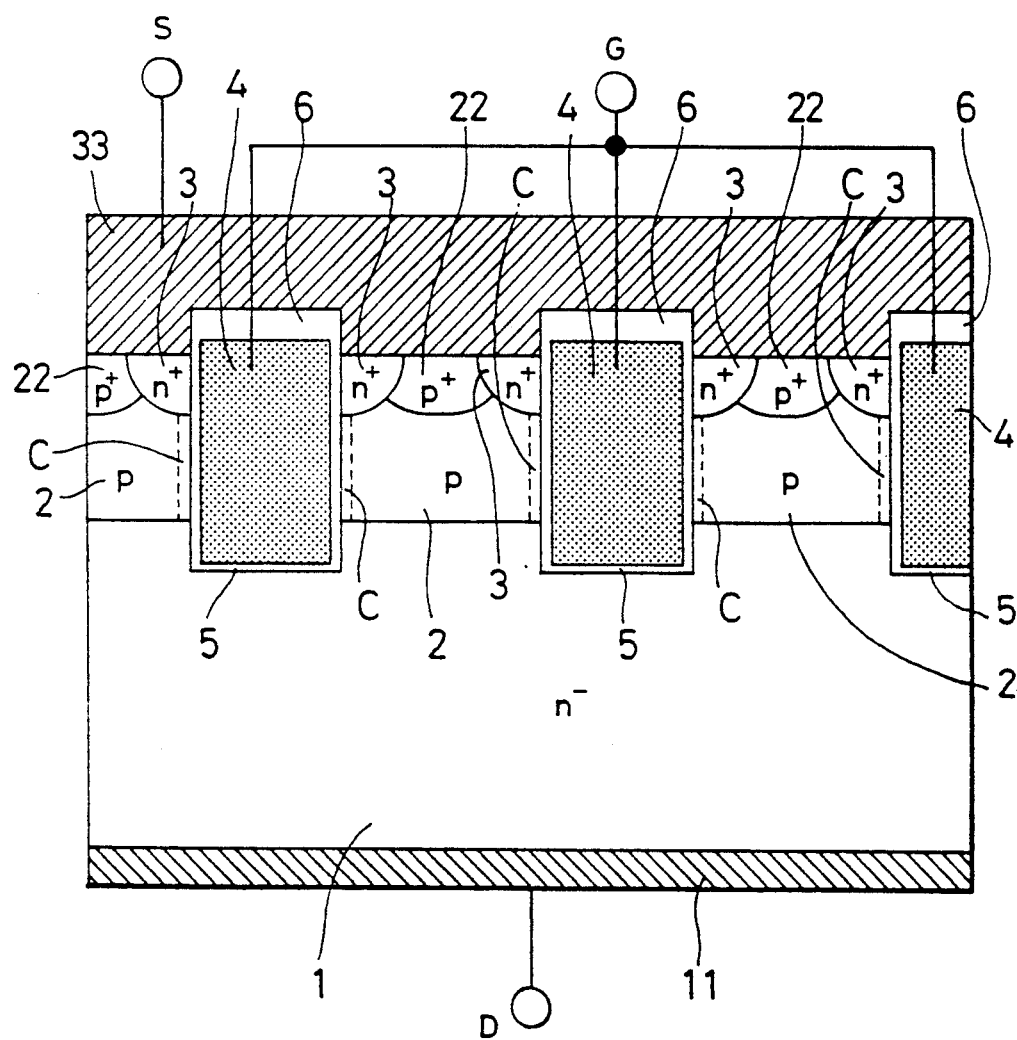
FIG. 2 is a sectional view of the conventional UMOSFET.
Figure 4A:
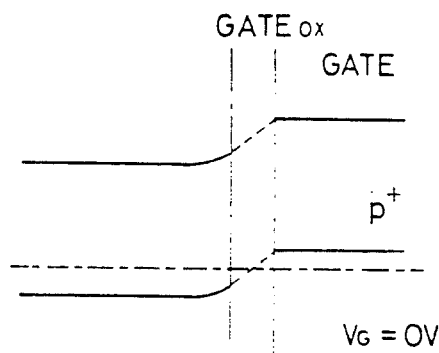
FIGS. 4A to 4D represent band diagrams of the channel region in the first semiconductor device shown in FIG. 3 and also conventional band diagrams.
Figure 4B:
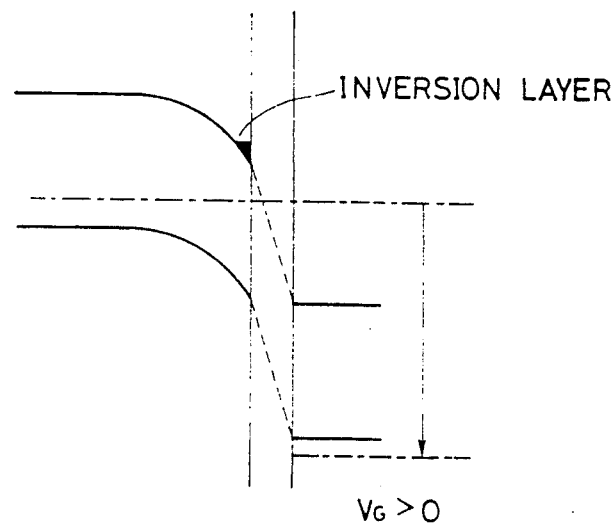

For comparison purposes, there are shown in FIG. 4A and 4B band diagrams of the section taken along the line A—A of the conventional semiconductor device shown in FIG. 1. That is to say, FIG. 4A and 4B represent band structures of the channel region in the conventional n-channel MOSFET. FIG. 4A illustrates a cut-off (interruption) state of the gate voltage, namely 0 volt. FIG. 4B represents a conduction state under which a predetermined positive voltage is applied to the insulating gate. It should be noted that the gate electrode is made of p+ type polysilicon for the easy comparison with respect to the present invention.

Under the cut-off state shown in FIG. 4A, since the potential at the boundary plane between the p+ type base region and the insulating film is low, no electron can pass therethrough. To the contrary, under the conduction state shown in FIG. 4B, a preselected positive voltage is applied to the gate electrode and thus the potential at the boundary plane is increased, so that the inversion layer is formed.

Figure 4C:
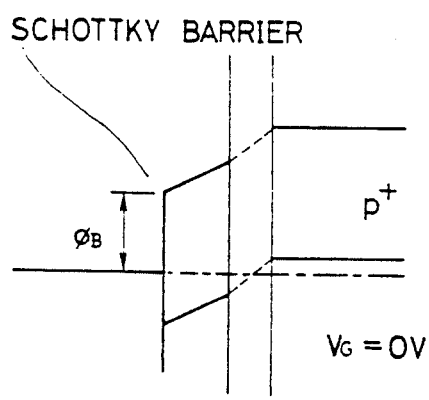
Figure 4D:
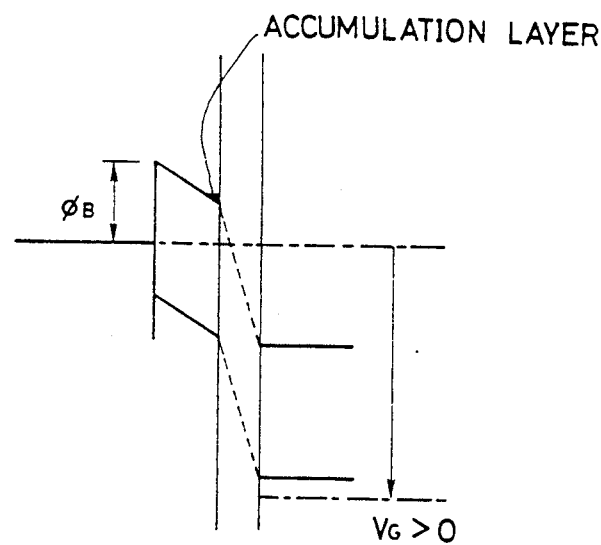

FIGS. 4C and 4D illustrates band structure diagrams of the section taken along the line A—A of the first semiconductor device shown in FIG. 3. In other words, FIG. 4C represents a band structure of the first semiconductor device under cut-off state, comparable with FIG. 4A, whereas FIG. 4D represents another band structure thereof under conduction state, comparable with FIG. 4B. It should be noted that the portion defined by the line A—A is sufficiently separated from not only the source region but also the drain region, and therefore is influenced by only the insulated gate and the Schottky junction. Also, the channel region is of n type different from that of the conventional MOSFET, and also the impurity density is sufficiently low.

Under the cut-off state shown in FIG. 4C, the potential of the channel region is lowered by the Schottky junction and the work function of p+ polysilicon, the gate electrode material which is grounded, similar to FIG. 4A, and thus this channel region is depleted whereby no electron can pass therethrough. Under the conduction state FIG. 4D, the potential at the boundary plane of the insulating film is increased in response to the gate potential, and therefore the accumulation layer is formed, resulting in the conduction condition. At this state, only the accumulation layer and the depletion layer are present within the channel region, and most of the conducting electrons are present only at the boundary plane of the gate insulating film.

Operation of the first MOS device will now be described.

Figure 5:
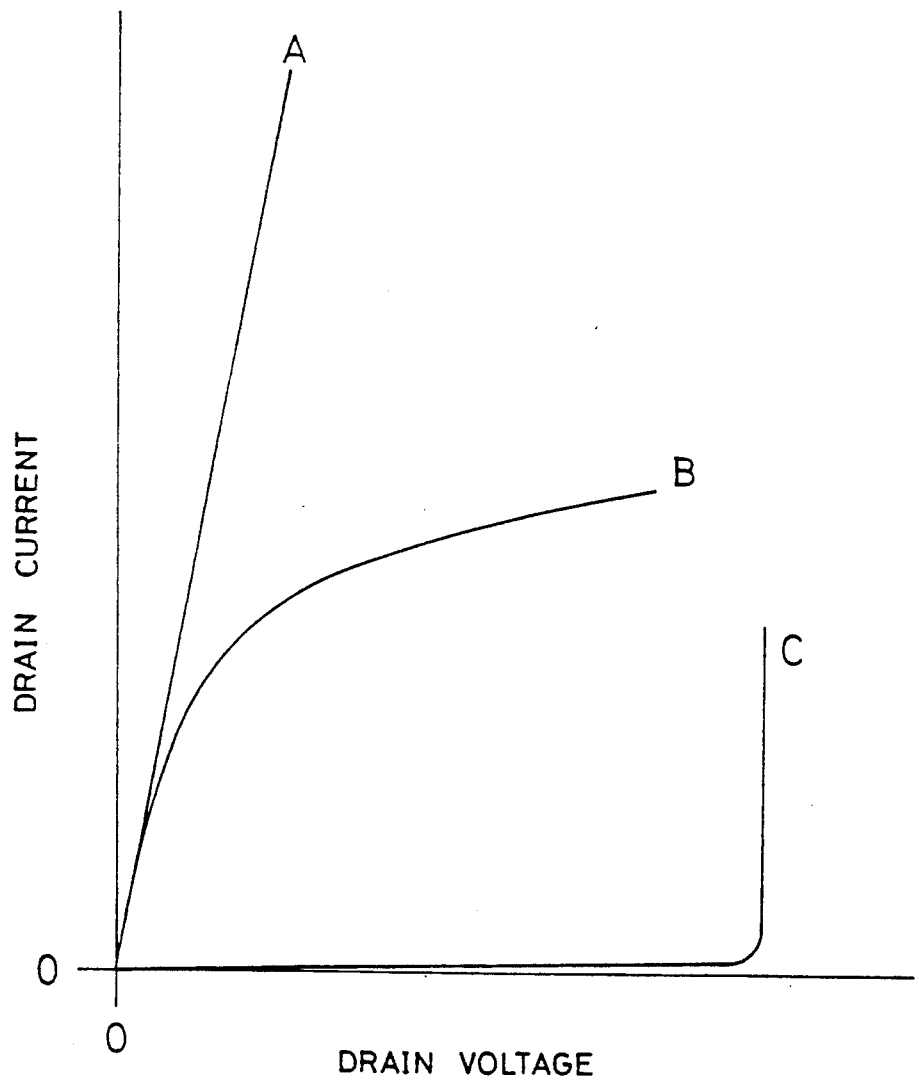
FIG. 5 represents a current-to-voltage characteristic graph of the first semiconductor device.

FIG. 5 represents a current-to-voltage characteristic of the first MOS device 1000.

It should be noted that the source electrode 33 is grounded whereas the drain electrode 11 is biased by a positive potential.

First, when the gate is grounded, no current flows through the first MOS device. If the ratio of the channel length "L" to the channel width "H" is selected to be proper value (namely this radio L/H is greater than a predetermined value), the channel may not be opened even when the drain voltage is increased up to a breakdown voltage of silicon, as represented in the characteristic curve 5-C of FIG. 5.

Subsequently, when a sufficiently higher positive potential is applied as the gate voltage so as to form the accumulation layer around the insulated gate, the source region 3 is electrically connected to the drain region 1 by the accumulation layer, whereby a current flows through the channel region. Since the accumulation layer in the channel region owns a sufficient density of conductive electrons, the resultant current-to-voltage characteristic represents no saturation as shown in a characteristic curve 5-A of FIG. 5.

When a relatively lower positive potential is applied to the gate, only a thinner accumulation layer is formed around the insulated gate so that a current flow is restricted by mobility of conduction electrons existing within this thinner accumulation layer, and a current-to-voltage characteristic represents a saturation characteristic 5-B as shown in FIG. 5. The reason why the drain current slightly becomes large in accordance with an increase in the drain voltage as represented in this curve 5-B, is such that the channel region is influenced by the drain field, whereby a distance where the accumulation layer is present becomes slightly short.

Various Conditions for Realizing Desirable Current Cut-Off States

Figure 6A:
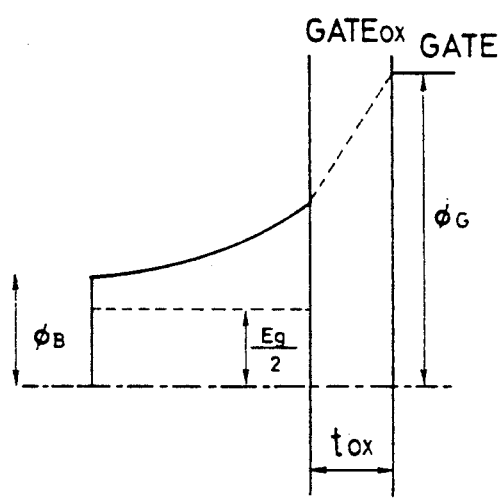
FIGS. 6A to 6C represent band diagrams of the channel structure of the first semiconductor device.
Figure 6B:
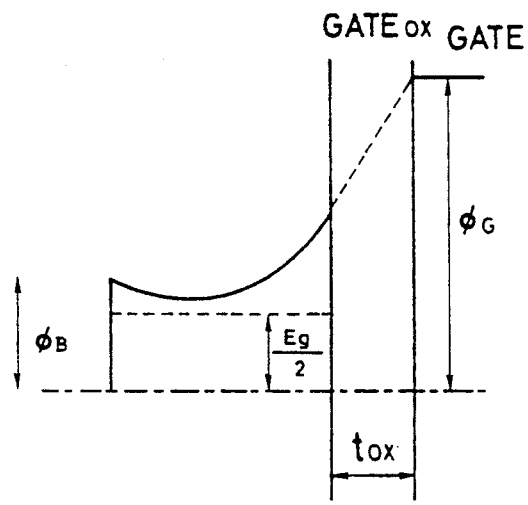
Figure 6C:
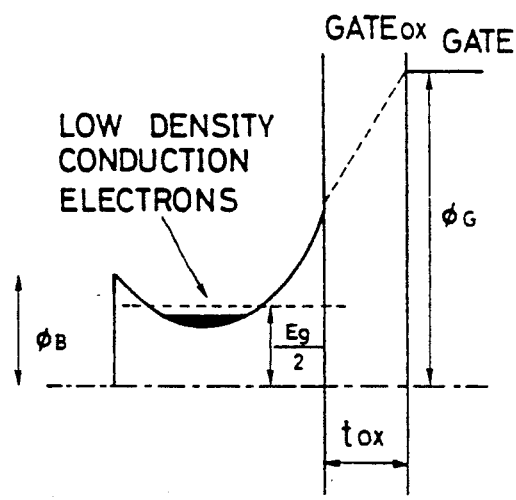

FIGS. 6A to 6C represent band diagrams for the section of the first MOS device, taken along the line A—A shown in FIG. 3. For the sake of convenience, there are shown only a lower line of a conduction band in a semiconductor region, a Schottky barrier, and an insulating film.

FIG. 6, symbol "$\phi_B$" represents a height of a potential at a lower end of a conductor made of p+ type polysilicon, which will function as a gate electrode, as a reference of the Fermi level; symbol "$\phi_B$" represents a barrier height of a Schottky junction between a channel region and the source metal 33; symbol "$E_g$" denotes a band gap of silicon, and also symbol "$t_{ox}$" represents a thickness of an insulating film. It should be noted that the gate electrode is under ground potential in FIG. 6.

As previously explained, various conditions represented in FIGS. 6A to 6C are used to realize better current cut-off states of the channel structures according to the present invention.

FIG. 6A represents such a condition that the potential distribution at the channel section has neither a maximal point (high peak), nor a minimal point (low peak) by selecting various amounts, the channel thickness "H" and also the impurity density "$N_D$", and there is no such a region that the majority carriers are concentrated into the channel region.

FIG. 6B illustrates such a condition that although a potential maximal point appears in the channel section, since a maximal value is smaller than $-E_g/2$ when the Fermi level is selected as a reference level, no majority carrier is present.

FIG. 6C represents such a condition that even when a maximal value is larger than $-E_g/2$ and the channel has been depleted, there is a region to which majority carrier is concentrated. Under this condition, a large amount of current will flow as a leak current.

Since the semiconductor devices according to the present invention are aimed to normally off type semiconductor devices, such various amounts as the impurity density "$N_D$" of the channel region and the channel thickness "H" must be selected in such a way that the region as represented in FIG. 6C is not formed. This condition may be readily obtained by solving a simple Poission's equation. For an example, if the impurity density "$N_D$" of the channel region is selected to be $1 \times 10^{15} cm^{-3}$, the channel thickness "H" is smaller than 1.07 $\mu$m or inclusive, and if the impurity density "$N_D$" is selected to be $1 \times 10^{16} cm^{-3}$, the channel thickness "H" is smaller than 0.27 $\mu$m or inclusive.

The potential at the channel region adjoining the source region shown in FIG. 1 is increased by receiving influences of the source region. It could be found from the predetermined calculations that this influenced region or portion reaches only at a distance substantially equal to the channel thickness "H" and directed from the source region to a center of the channel region within a range where the above-described various conditions shown in FIG. 6 are satisfied, irrelevant to other conditions.

In case of this first preferred embodiment, even when the voltage up to the avalanche breakdown condition of silicon is applied to the drain electrode, the portion of the channel at the drain side to which the above-described potential increase influence is given, will reach only at a distance substantially equal to the channel thickness.

As a consequence, in accordance with this preferred embodiment, not to open or conduct the channel of the first MOS device even if the drain voltage increased to a desirable higher breakdown voltage, the channel length "L" must be designed to be 2.0 to 2.5 times greater than the channel thickness "H", preferably be 3 to 4 times greater than the channel thickness "H". For instance, according to the first preferred embodiment, in case of the channel thickness "H" having 3,000 Å (angstroms), the channel length "L" is selected to be 1 to 1.2 $\mu$m, and in case of the channel thickness "H" having 1,000 Å, the channel length "L" is selected to be 0.3 to 0.4 $\mu$m.

Figure 7:
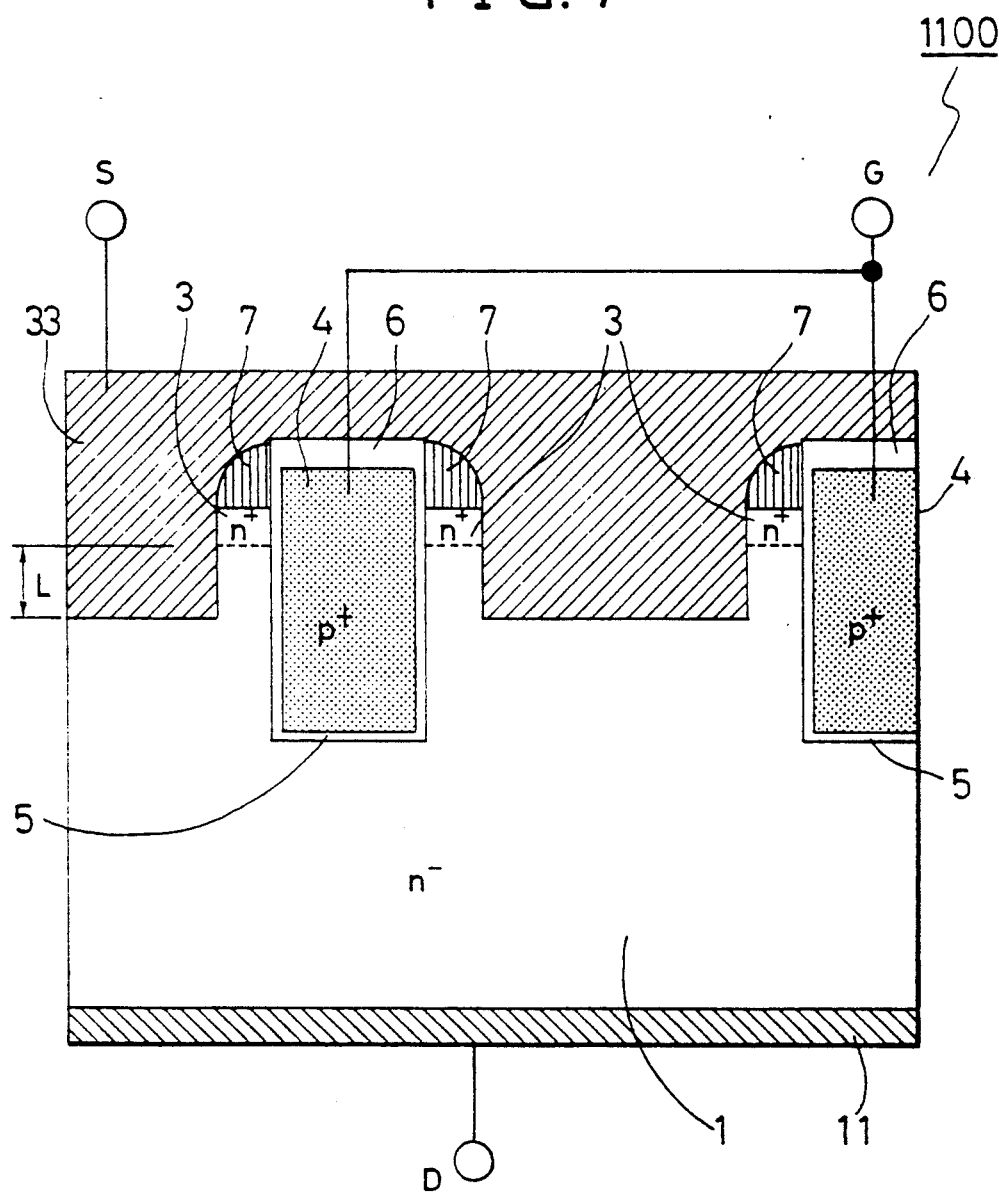
FIG. 7 is a sectional view of a modification of the first semiconductor device.

Although the depth of the insulated gate is equal to that of the source electrode metal 33 in the first MOS device shown in FIG. 3, a depth of a source electrode metal 33 shown in FIG. 7 may be shallowed as compared with the depth of the source electrode metal 33 of FIG. 3. In this modification 1100 shown in FIG. 7, since the electric field applied to the bottom of this source metal 33 and also the channel is relaxed, the allowable breakdown voltage may be increased and the channel length "L" may be shorten by approximately as half length of the channel length shown in FIG. 3.

Also, if corner portions of the source metal 33 and the insulated gate electrode 4 are formed not in an acute angle, but in curved surfaces, the electric field applied thereto may be mitigated.

In any modifications, the ratio of the channel length "L" to the channel thickness "H" should be selected to be such a value that the channel is not opened even when the drain voltage is increased to a desirable higher breakdown voltage.

Manufacturing Step of First MOS

Referring now to FIGS. 8A to 8F, a manufacturing step of the first MOS device 1000 shown in FIG. 3 will now be described.

Figure 8A:
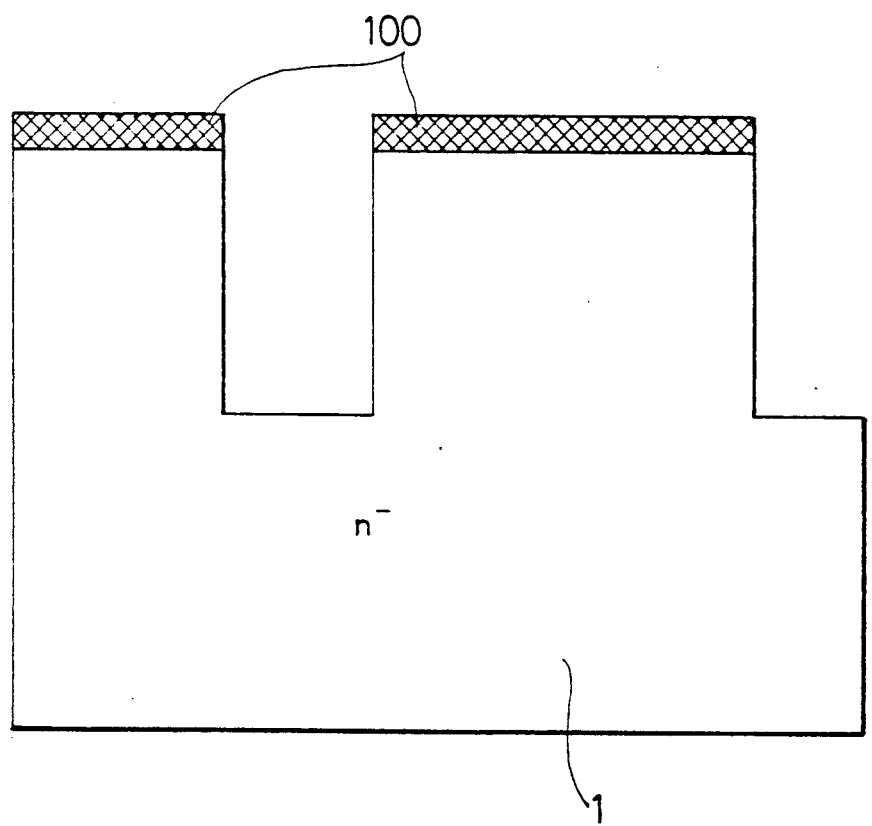
FIGS. 8A to 8F illustrate a manufacturing step of the first semiconductor device.

At a first step, as represented in FIG. 8A, a masking material 100 is patterned on a surface of an n-type silicon substrate and a groove used for an U-shaped insulated gate is etched thereon. This etching operation is carried out in such a manner that this groove may be formed substantially perpendicular to the surface of the substrate by employing a directional dry etching.

Figure 8B:
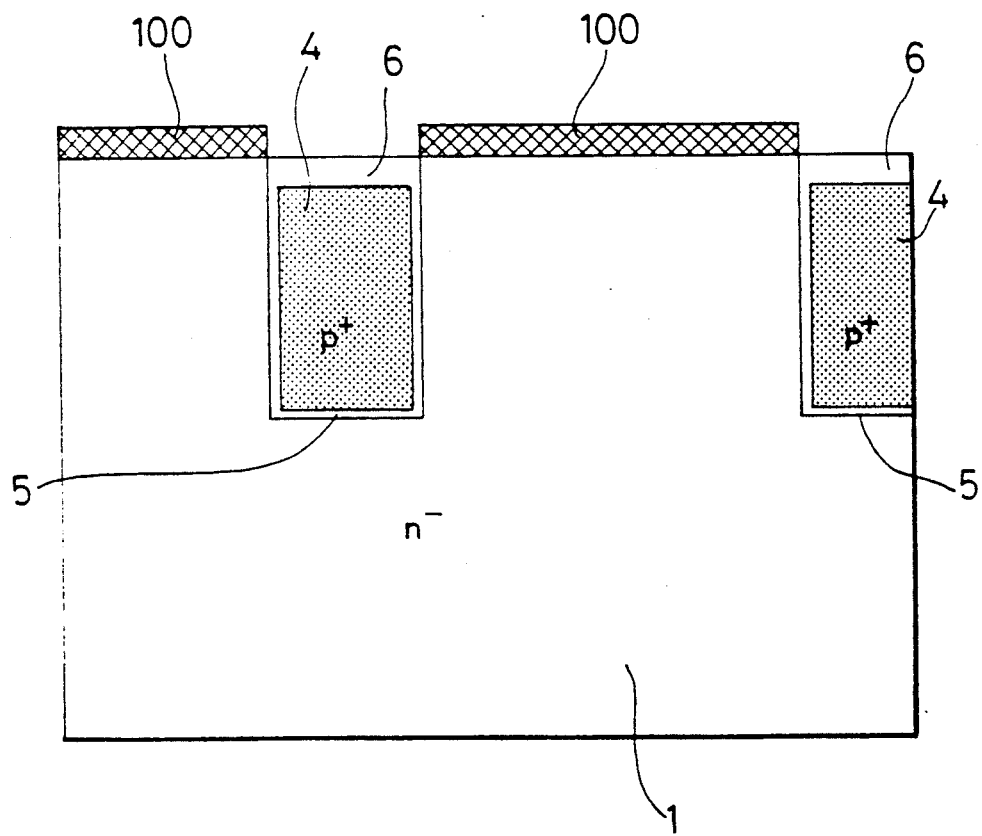

Next, as shown in FIG. 8B, a gate oxide film 5 is formed on an inner wall of this groove. Subsequently, a p+ type polysilicon 4 is deposited on this groove and thereafter a surface of the deposited polysilicon 4 is etched so as to be made flat. Then, the surface of this p+ type polysilicon 4 functioning as the gate electrode is subjected to oxidation, whereby the insulated gate is accomplished.

Figure 8C:
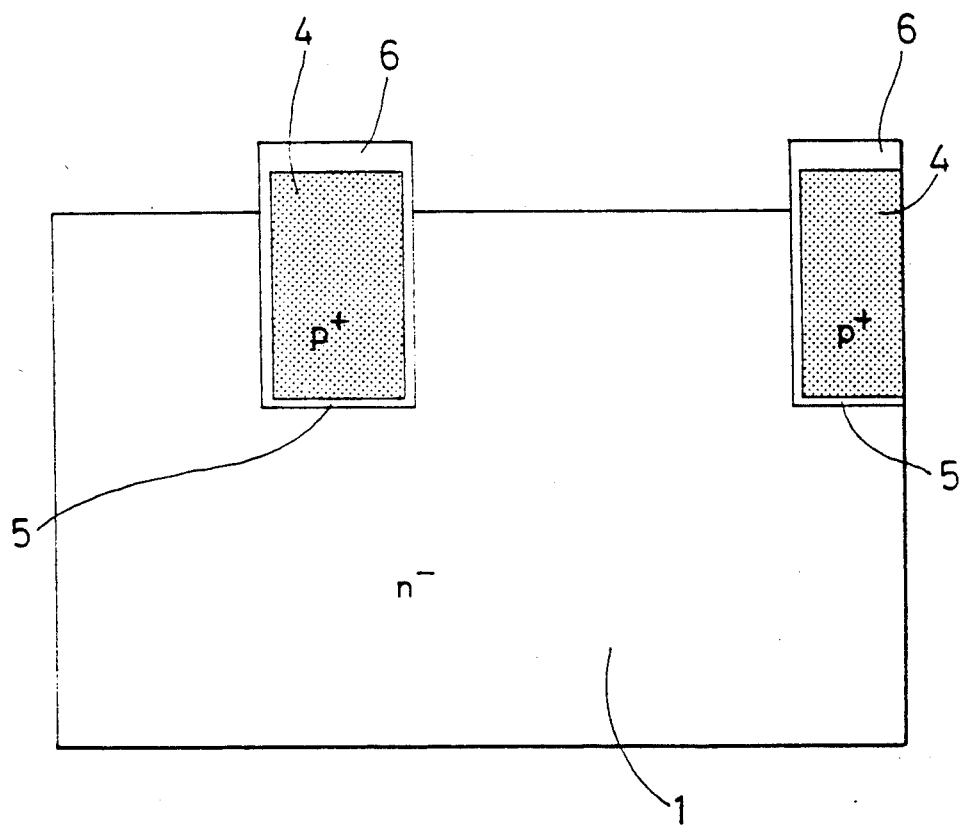

Subsequently, as shown in FIG. 8C, the masking material 100 is removed, and the exposed silicon substrate 1 is etched in order to expose a portion of the insulating gate.

Figure 8D:
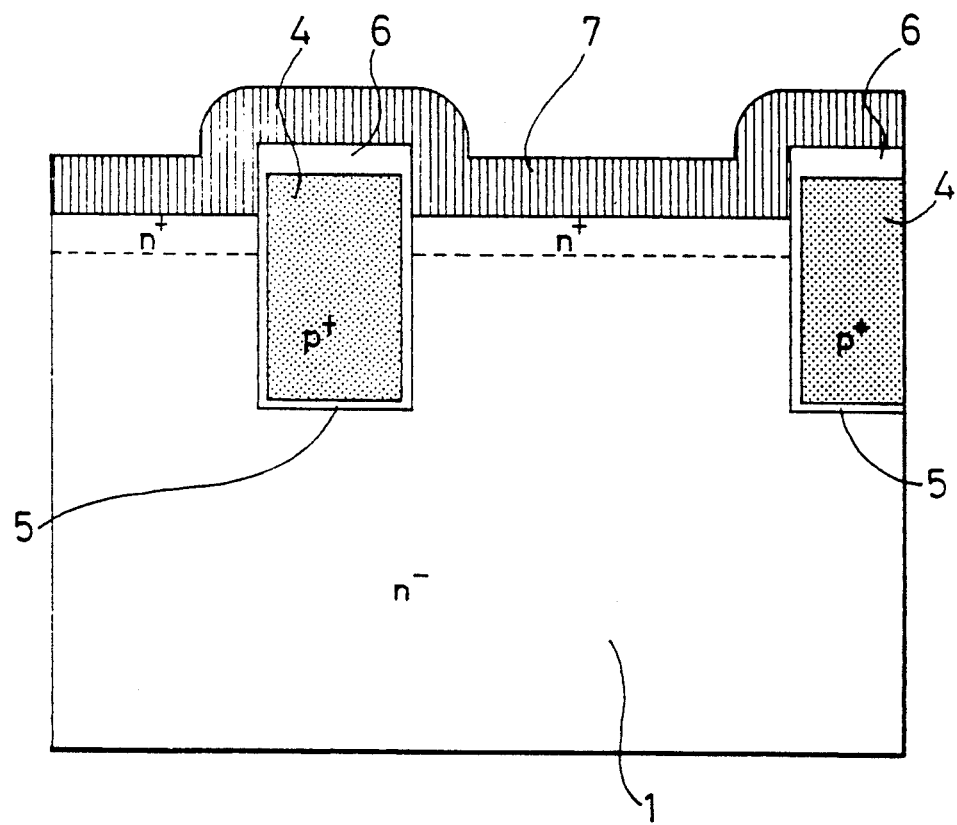

Thereafter, as represented in FIG. 8D, another masking material of made of, for example, a phosphosilicate glass is deposited. At this time, this masking material 7 is deposited in such a manner that the thickness of the masking material 7 has the same thickness as that of the flat portion also at the side wall of the exposed insulated gate. If the resultant semiconductor device is heated for a short time period, an n+ region which will become the source region 3 is formed by diffusing impurities from the phosphorus glass. It should be noted that this source region may be formed by way of an ion injection and employing other masking materials.

Figure 8E:
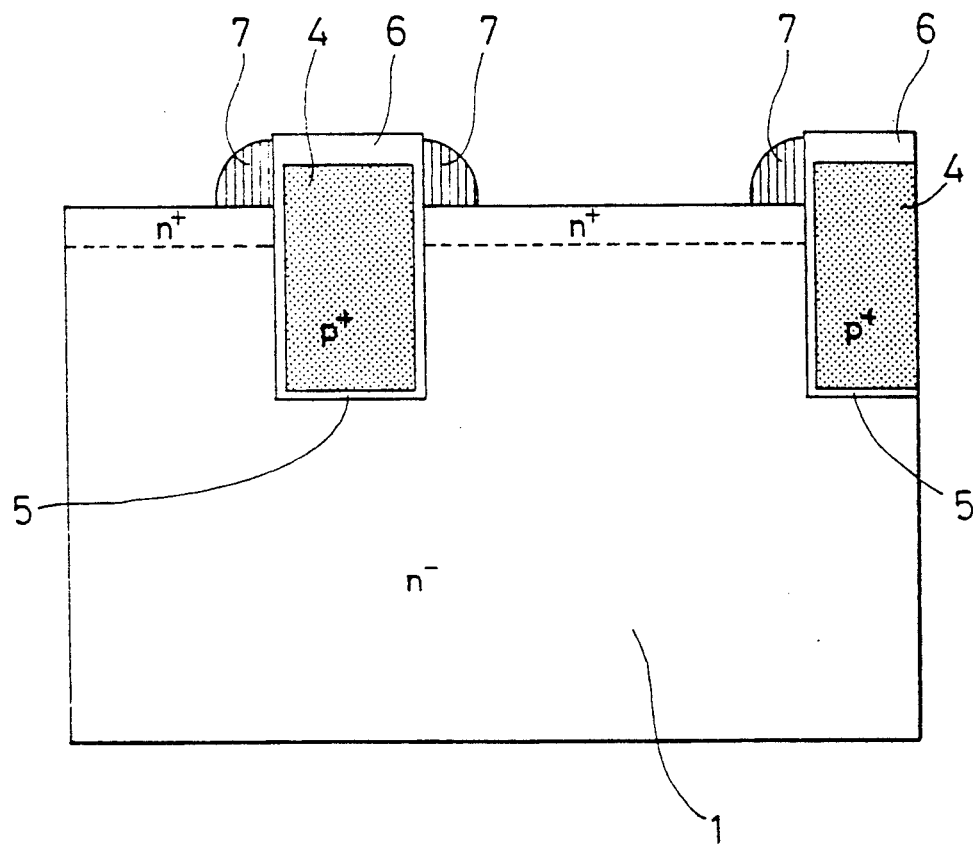

At the next step as shown in FIG. 8E, the above-described masking material 7 is etched to the surface of the substrate by way of the directional dry etching, and then this masking material 7 is left only at the side walls of the exposed insulated gate. According to the present invention, the channel thickness "H" of the semiconductor element may be precisely controlled by way of the thickness (i.e., a width in a transverse direction, as viewed in FIG. 8E) of the masking material 7.

Figure 8F:
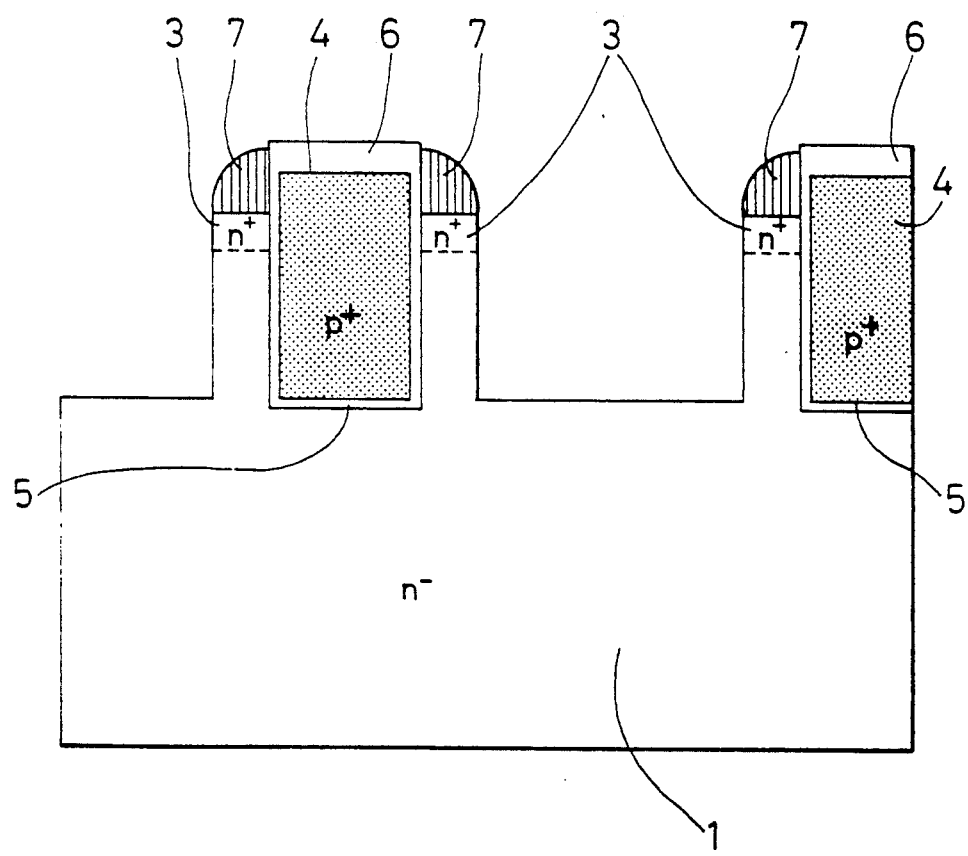

Finally, as represented in FIG. 8F, the masking material 7 formed at the side walls is utilized as a masking material when the silicon substrate is vertically etched by using the directional dry etching, whereby a groove for the source electrode metal is formed.

Then, the source metal is vapor-deposited or this groove and a patterning process is performed, so that the resultant basic structure, shown in FIG. 3, for the first MOS device 1000 may be fabricated.

It should be understood that the source metal establishes a Schottky junction with the silicon substrate functioning as the drain region 1, and is connected to the source region at the surface in an ohmic contact. Furthermore, a plain structure of the insulated gate may be formed as a stripe structure, or a mesh structure.

In the first semiconductor device with the above-described novel structure, the channel resistance can become roughly ten times lower than that of conventional MOSFET, due to the following reasons:

A) Although this device has a short channel length, it can maintain a sufficient channel cut-off characteristic as in the conventional MOSFET.

B) The channel of this device is consisted of the accumulation layer the resistivity of which is lower than that of the inversion layer, which is used in the conventional MOSFET as the channel system.

C) Only one photoprocess is required to obtain a fundamental structure shown in FIG. 3, and the channel is formed in depth direction of the semiconductor substrate, so that unit structure may be made small and the channel density may be increased.

Structure of Second Semiconductor Device

FIG. 9 is a sectional view of a semiconductor device 2000 according to a second preferred embodiment of the present invention.

The second semiconductor device 2000 of FIG. 9 is similar to the first semiconductor device 1000 of FIG. 3, and has such a featured structure that a p type impurity region 10 is formed on the plane of the source electrode metal 33 which is positioned not opposite to the insulating gate (namely the plane directly in contact with the drain region 1, i.e., a lower plane of this metal 33), in addition to the basic structure of the first semiconductor device 1000 shown in FIG. 3.

Since such a p type impurity region 10 is newly employed, a leak current from the Schottky junction producing when the main current is interrupted may be considerably reduced.

Structure of Third Semiconductor Device

Figure 10A:
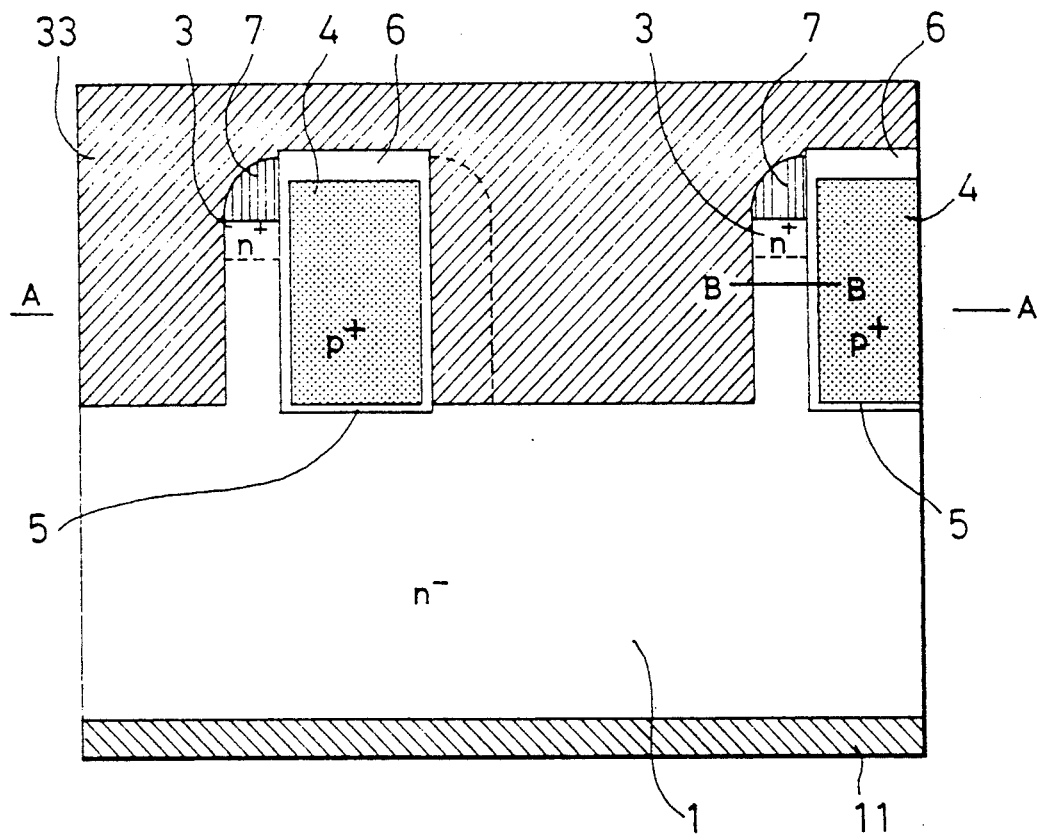
FIGS. 10A and 10B are sectional views of a semiconductor device according to a third preferred embodiment of the present invention.
Figure 10B:
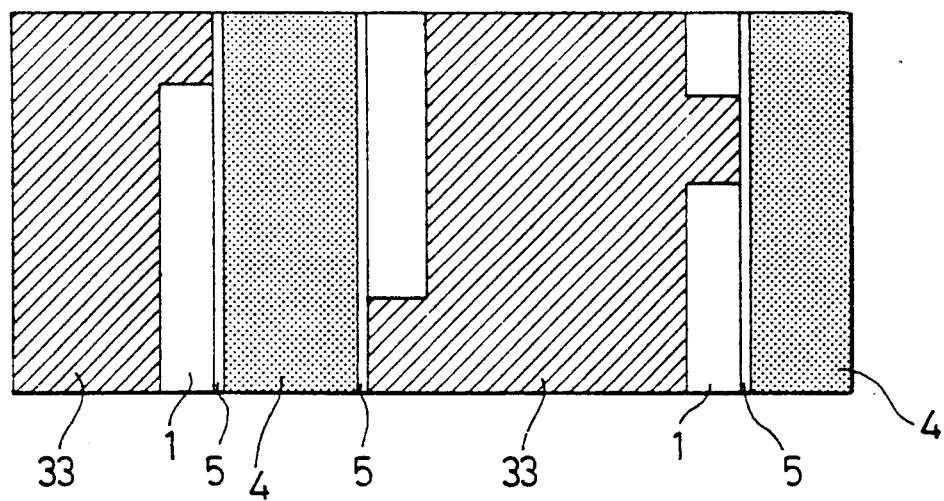
Figure 10C:
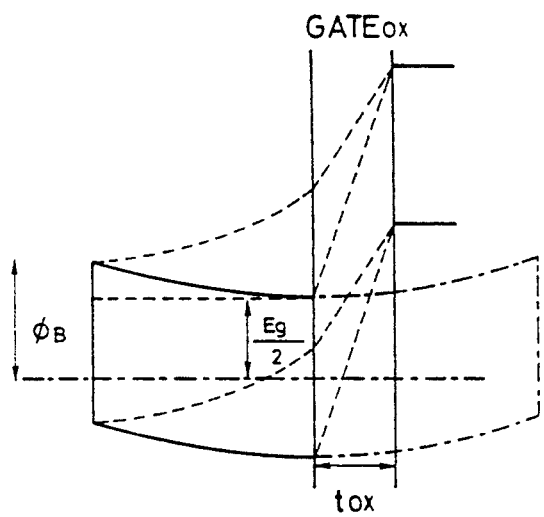
FIGS. 10C and 10D show band diagrams of the third semiconductor device.
Figure 10D:
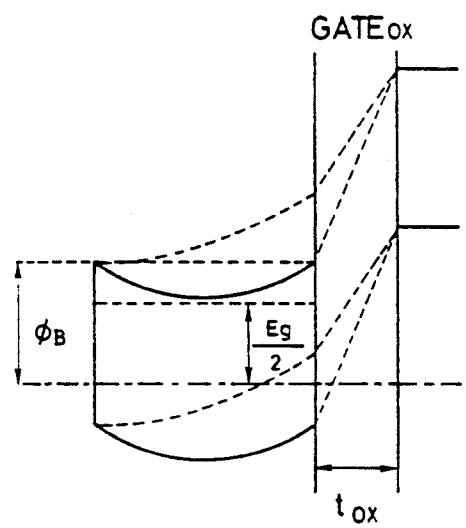

A structure of a semiconductor device 3000 according to a third preferred embodiment of the present invention will now be described with reference to FIGS. 10A to 10D. FIG. 10A is a sectional view of the third semiconductor device 3000; FIG. 10B is a sectional view of the third semiconductor device 3000, taken along a line A—A of FIG. 10A; FIG. 10C is a band structure diagram of the section, taken along the line B—B of FIG. 3; and, FIG. 10D is a band structure diagram of the section, taken along a line B—B of FIG. 10A.

A structure of the third semiconductor device 3000 has such a feature that a portion of the source electrode metal 33 is directly in contact with the gate insulating film 5 along a direction of the channel width, namely in the vertical direction, as viewed in FIG. 10B, in the basic structure of the first semiconductor device 1000 shown in FIG. 3.

In principle, the semiconductor device according to the present invention corresponds to a unipolar device. In case of the first semiconductor device 1000, a current carrier corresponds to an electron. However, there is a risk that the channel happens to open depending upon the restricted condition. That is to say, when the holes are produced within the depletion layer, a part of these holes is sucked by the source metal 33 and also other holes gather and form the inversion layer at the surface of the insulated gate, and then are flown into the channel region. As a result, the potential at the surface of the insulating film 5 adjoining the channel region is increased, whereby the channel happens to open. When the potential at the insulating film 5 within the channel region becomes higher than the opposite Schottky barrier, the holes are flown into the source electrode. Under such a circumstance, the condition that no channel is opened is given by the following formula (1):

$$\frac{q \cdot N_D}{2 \, \xi_{Si}} H^2 > \phi_B - E_g/2 \qquad (1)$$

Such conditions will now be described with reference to FIGS. 10C and 10D.

FIG. 10C is a band diagram of the section of the first MOS device 1000 shown in FIG. 3, taken along the line A—A, whereas FIG. 10D is a band diagram of a channel portion (section taken along the line B—B of FIG. 10A) shown in FIG. 10A.

The band structure of the channel region of the FIG. 3 is represented by a dot line of FIG. 10C. This is the same condition as that of FIG. 6A. When the holes gather at the boundary plane of the insulating film, the potential at this insulating film boundary is increased, when the potential is increased up to a condition indicated by a solid line of FIG. 10C, the holes start to flow into the Schottky junction side. Even under such a condition, if the potential at the boundary plane corresponding to the portion in the channel at the maximum potential is below than $-E_g/2$, it is understood that the channel never opens.

On the other hand, as shown in FIGS. 10A and 10B, when the source metal 33 is in contact with the insulating film 5, the potential at the surface of the insulating film of the channel region adjacent to it does not increase higher than the Schottky barrier of the source electrode. In other words, as represented in FIG. 10D, even when the holes are accumulated at the boundary plane of the insulating film so that the potential is increased, the potential remains under the condition indicated by the solid line of FIG. 10D, similar to FIG. 10C. At this time, a maxim potential appears at a midcenter of the channel. However, if this potential is below than $-E_g/2$, then the channel does not open. When this condition is expressed by a formula, this potential is allowable within a range defined by the following formula (2):

$$\frac{q \cdot N_D}{2 \, \xi_{Si}} \left(\frac{H}{2}\right)^2 > \phi_B - E_g/2 \qquad (2)$$

As apparent from the comparison between the above-described formulae (1) and (2), if this method is employed, the impurity density of the channel region may be allowed to be 4 times higher than that of the first semiconductor device shown in FIG. 3 in case that the channel thicknesses "H" of two semiconductor devices are equal to each other. As a consequence, the electric resistivity of the accumulation layer may be furthermore lowered.

Structure of Fourth Semiconductor Device

Figure 11A:
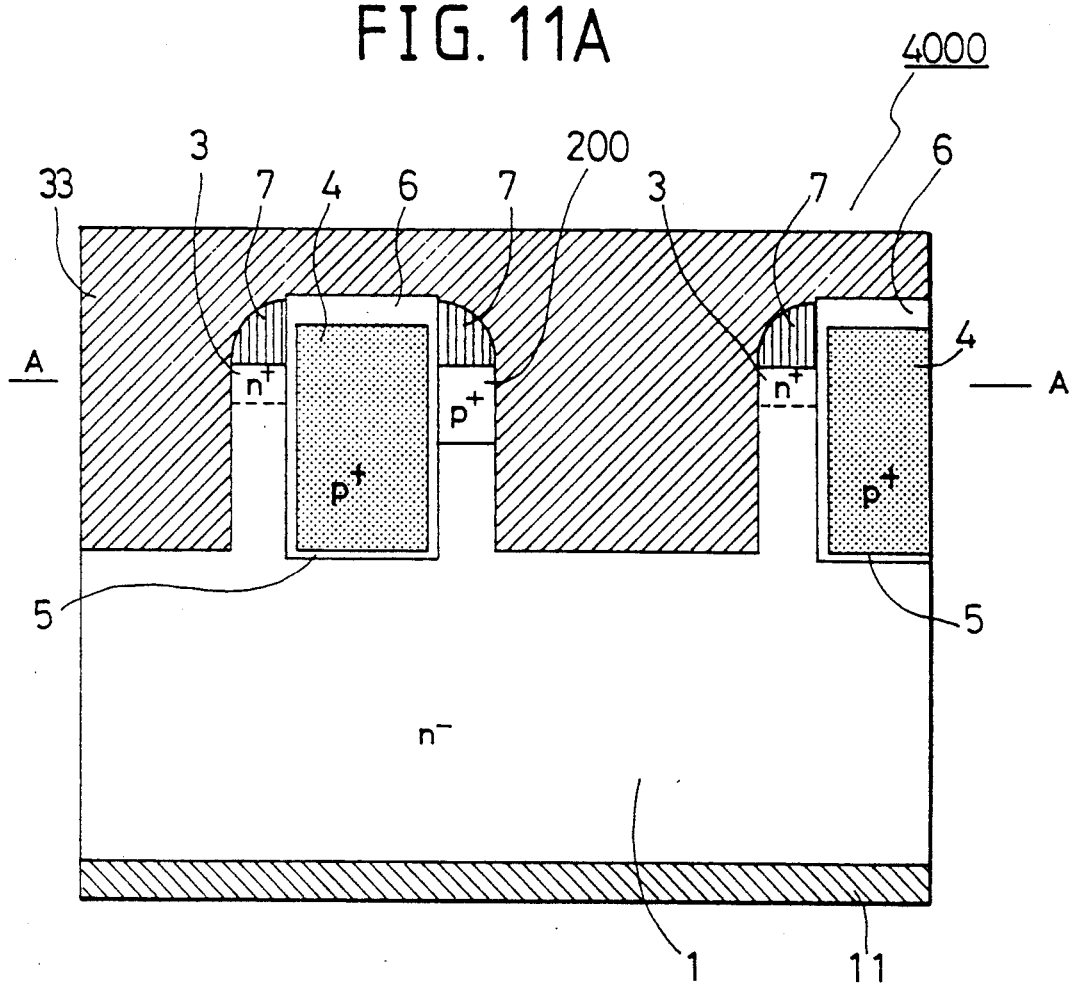
FIG. 11A is a sectional view of a semiconductor device according to a fourth preferred embodiment of the present invention.
Figure 11B:
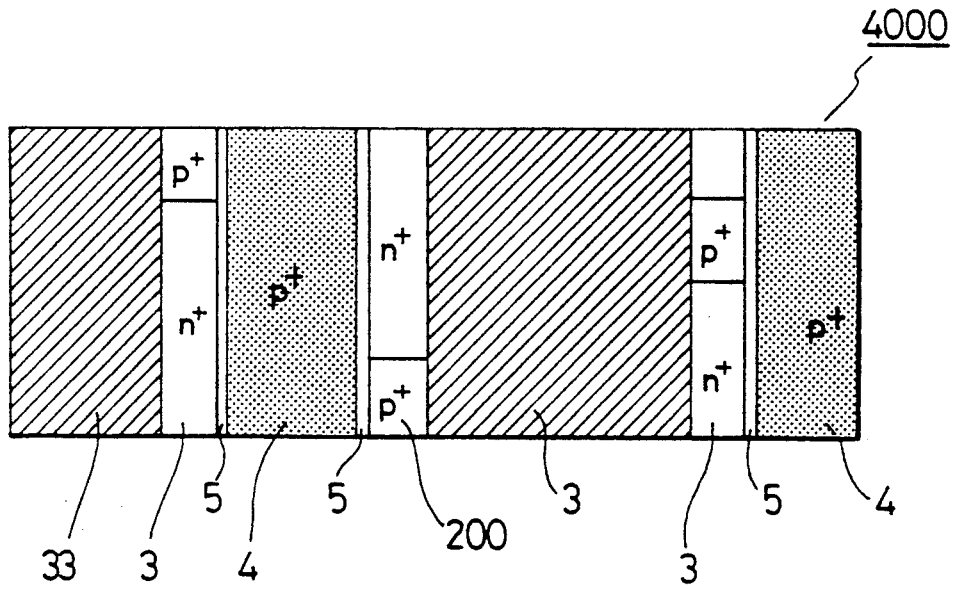
FIG. 11B is a sectional view of the fourth semiconductor device, taken along a line A—A of FIG. 11A.
Figure 11C:
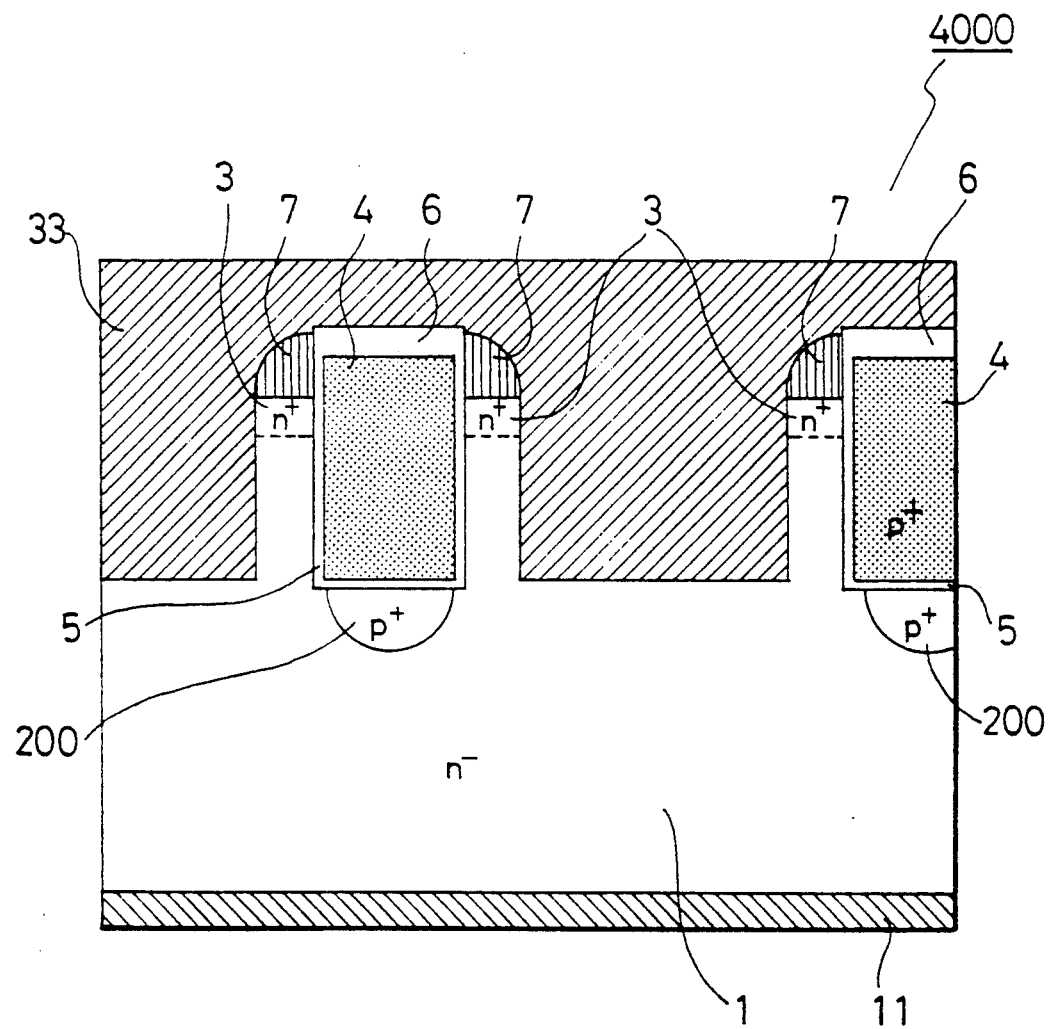
FIGS. 11C and 11D are sectional views of modifications of the fourth semiconductor device; and, FIG. 12 is a sectional view of a semiconductor device according to a fifth preferred embodiment of the present invention.

A semiconductor device 4000 according to a fourth preferred embodiment will now be described with reference to FIG. 11. FIG. 11A is a sectional view of the fourth semiconductor device 4000; FIG. 11B is a sectional view of the fourth semiconductor device 4000, taken along a line A—A of FIG. 11A; FIG. 11C is another sectional view thereof; and FIG. 11D is a sectional view of an end portion of this semiconductor element.

The structures shown in FIGS. 11A and 11B have such a feature that a p type region 200 electrically connected to the source region 7 is newly employed, instead of the portion of the source metal 33 which is directly in contact with the insulating film 5 in the third semiconductor device 3000 shown FIG. 10A. According to this feature structure of the fourth semiconductor device 4000, since the holes collected to the surface of the insulated gate are sucked to this p type region 200, no inversion layer is formed at the boundary plane of the gate insulating film, so that no potential is increased.

It should be noted the above-described p type region 200 may be formed on the bottom of the insulated gate, and may be connected to the source electrode at another region different from that of the basic structure 1000 shown in FIG. 3, as represented in FIG. 11C.

Figure 11D:
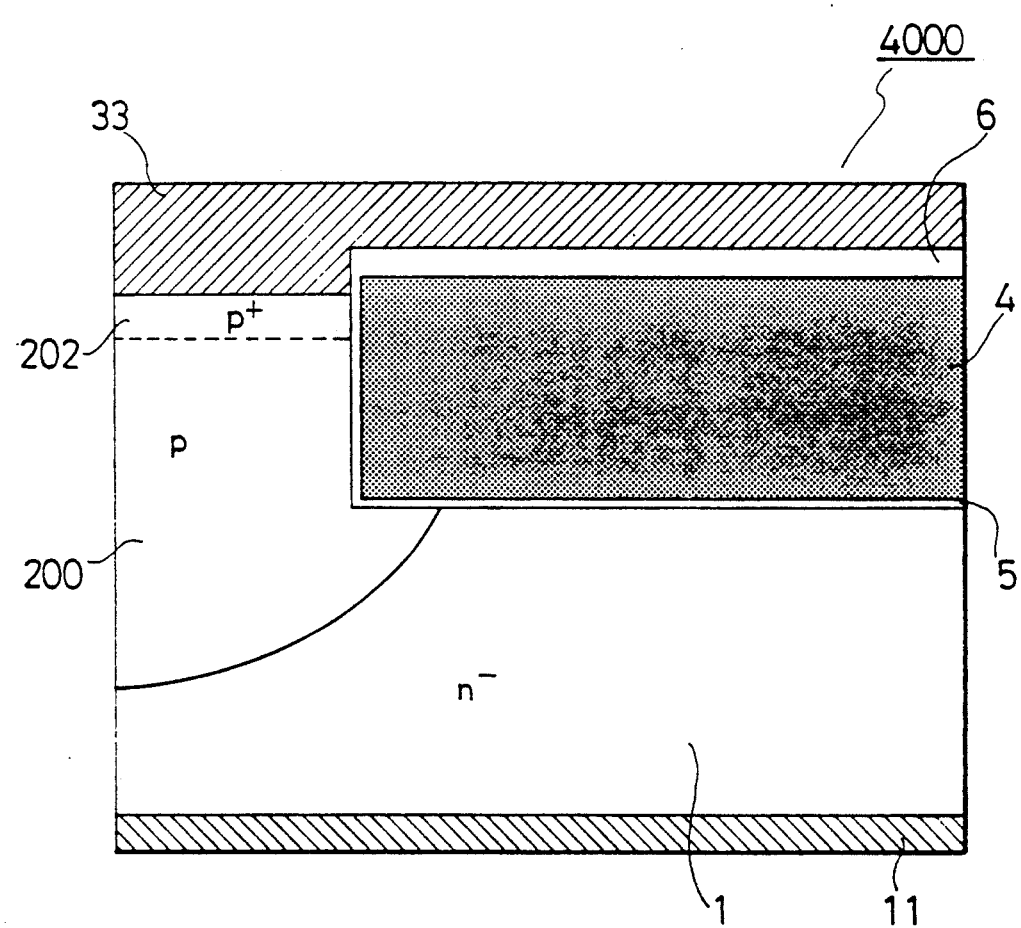

FIG. 11D is a sectional view of such an end portion of an element, taken along the line B—B shown in FIG. 3, which has a stripe-shaped gate structure and the same sectional structure as that of FIG. 3. A p+ type region 202 is employed for a contact.

As apparent from the foregoing description, a peripheral guard ring connected to the source electrode 33 may be used as the p type region 200 which is provided in contact with an end portion of the insulated gate.

Structure of Fifth Semiconductor Device

FIG. 12 is a sectional view of a semiconductor device 5000 according to a fifth preferred embodiment of the present invention.

The fifth semiconductor device 5000 has such a feature that a p+ type region 101 is sandwiched between the drain region 1 and the drain electrode 11 in addition to the basic structure 1000 of FIG. 3.

Under operating conditions of this fifth element, the drain region 1 is brought into a higher injection level of minority carriers, whereby conductivity of the fifth element 5000 may be considerably lowered. A portion of the injected holes disappears within the drain region 1, whereas the remaining holes flow into the source region 33 positioned in contact with the drain region 1.

The fifth semiconductor device 5000 has particular advantages that the current capacity may be considerably increased by utilizing the conductivity modulation effect and moreover the injected minority carriers are not accumulated around the electrode. Also, there is very little accumulation of the minority carriers. As a consequence, the fifth element 5000 may be constructed as a highspeed switching device, as compared with the normal bipolar transistor.

I claim:
1. A semiconductor device comprising:
 a drain region made of one conductivity type semiconductor substrate and having first and second major surfaces;

a drain electrode for forming an ohmic contact with said drain region, and located on said second major surface of said drain region;

first and second grooves, each having a U-shape and dug from said first major surface of said drain region;

a gate electrode covered with an insulating film and formed in said first groove;

a source electrode metal embedded in said second groove, for forming a Schottky junction with said drain region;

a source region made of the same conductivity type semiconductor as that of said drain region, formed at said first major surface of said drain region, and being in contact with said source electrode metal at one side thereof and with said insulating film at the other side thereof;

a channel region corresponding to a portion of said drain region, being in contact with said source region, and being sandwiched by said source electrode and said gate electrode covered with the insulating film, said channel region being depleted by both a difference in work functions between the materials of said gate electrode and of said drain region, and also said Schottky junction, when at least a potential of said gate electrode is equal to a potential of said source electrode;

wherein a ratio of a channel length to a channel thickness is set to such a value that said channel region is not brought into an open state even when the electric potential of said gate electrode is substantially equal to the electric potential of said source electrode, and the electric potential of said drain electrode is substantially equal to a breakdown voltage of said semiconductor device, said channel length being defined by a distance from a first boundary plane between said source region and said channel region to the bottom of said second groove for embedding said source electrode, and measured along the side wall of said second groove, and said channel thickness being defined by a distance from a second boundary plane between said source electrode metal and said channel region to a third boundary plane between said insulating film and said channel region, and measured along said first major surface of said drain region.

2. A semiconductor as claimed in claim 1, further comprising:

a semiconductor region having an opposite conductivity type formed on at least a portion of a fourth boundary plane between said source electrode metal and said drain region not facing said gate electrode.

3. A semiconductor device as claimed in claim 1, wherein a portion of said source electrode is in contact with said insulating film.

4. A semiconductor device as claimed in claim 1, further comprising:

a semiconductor region having an opposite conductivity type formed on at least a portion of a fifth boundary plane between said drain region and said insulating film not facing said source electrode metal, which is held at the same electric potential as that of said source electrode.

5. A semiconductor device as claimed in claim 1, further comprising:

a semiconductor region having an opposite conductivity type formed on at least a portion of a sixth boundary plane between said drain region and said drain electrode.

6. A semiconductor device as claimed in claim 1, wherein the depth of said first U-shaped groove is deeper than the depth of said second U-shaped groove along a direction of the side wall thereof.

7. A semiconductor device as claimed in claim 1, wherein said one conductivity type of said drain region is n-type, and said opposite conductivity type is p-type.

* * * * *